(12) United States Patent
Tseng

(10) Patent No.: US 6,376,342 B1
(45) Date of Patent: Apr. 23, 2002

(54) METHOD OF FORMING A METAL SILICIDE LAYER ON A SOURCE/DRAIN REGION OF A MOSFET DEVICE

(75) Inventor: Horng-Huei Tseng, Hsin-Chu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 34 days.

(21) Appl. No.: 09/671,511

(22) Filed: Sep. 27, 2000

(51) Int. Cl.$^7$ ............................................ H01L 21/425
(52) U.S. Cl. ...................... 438/517; 438/581; 438/583; 438/305
(58) Field of Search ............................... 438/517, 305, 438/238, 585, 592, 558, 537, 580, 581, 582, 583

(56) References Cited

U.S. PATENT DOCUMENTS

| | | | |
|---|---|---|---|
| 4,672,419 A | * 6/1987 | McDavid | 357/71 |
| 5,352,631 A | * 10/1994 | Sitaram et al. | 437/200 |
| 5,409,853 A | * 4/1995 | Yu | 437/41 |
| 5,480,814 A | * 1/1996 | Wuu et al. | 437/41 |
| 5,480,830 A | * 1/1996 | Liao et al. | 437/58 |
| 5,585,295 A | * 12/1996 | Wu | 437/44 |
| 5,723,893 A | * 3/1998 | Yu et al. | 257/413 |
| 5,783,478 A | * 7/1998 | Chau et al. | 438/592 |
| 5,858,849 A | * 1/1999 | Chen | 438/305 |
| 6,087,700 A | 7/2000 | Fazan et al. | 257/413 |
| 6,150,243 A | * 11/2000 | Wieczorek et al. | 438/558 |
| 6,171,939 B1 | * 1/2001 | Lin | 438/585 |
| 6,225,155 B1 | * 5/2001 | Lin et al. | 438/238 |
| 6,235,599 B1 | * 5/2001 | Yu | 438/305 |

FOREIGN PATENT DOCUMENTS

| | | | | |
|---|---|---|---|---|
| JP | 10223558 A | * | 8/1998 | H01L/21/28 |
| JP | 2000138295 A | * | 5/2000 | H01L/21/8238 |

* cited by examiner

*Primary Examiner*—Caridad Everhart
*Assistant Examiner*—Renzo N. Rocchegiani
(74) *Attorney, Agent, or Firm*—George O. Saile; Stephen B. Ackerman

(57) ABSTRACT

A process of forming a metal silicide layer, on a source/drain region of a MOSFET device, featuring ion implanted metal ions providing the metal component of the metal silicide layer, has been developed. After formation of a heavily doped source/drain region, in an area of a semiconductor region not covered by a insulator capped, gate structure, or by insulator spacers on the sides of the insulator capped gate structure, metal ions are implanted into the top surface of the heavily doped source/drain region. The metal ions are chosen from a group that includes titanium, tantalum, platinum, palladium, nickel and cobalt ions. An anneal procedure is then employed resulting in the formation of the metal silicide layer on the heavily doped source/drain region. Selective removal of unreacted metal ions is then accomplished via use wet etchant solutions. The use of implanted metal ions, when compared to a deposited metal layer, reduces the risk of unremoved metal, or formation of metal silicide ribbons, located on the surface of insulator, at the conclusion of the selective removal procedure, resulting in gate to substrate leakage or shorts.

21 Claims, 2 Drawing Sheets

METHOD OF FORMING A METAL SILICIDE LAYER ON A SOURCE/DRAIN REGION OF A MOSFET DEVICE

BACKGROUND OF THE INVENTION (1) Field of the Invention

The present invention relates to methods used to fabricate semiconductor devices, and more specifically to a method used to form a metal silicide layer on a source/drain region of a metal oxide semiconductor field effect transistor, (MOSFET).

(2) Description of Prior Art

The semiconductor industry is continually striving to improve the performance of semiconductor devices. This objective has in part been satisfied via micro-miniaturization, or the ability to fabricate semiconductor devices with sub-micron features. Advances in specific fabrication disciplines such as photolithography and dry etching have allowed the attainment of devices with sub-micron features to be realized. Sub-micron regions result in areas of decreased capacitance, when compared to counterparts fabricated with larger features, thus reducing the capacitance component of the device RC delay. In addition the resistance component of the RC factor has in part been addressed via resistance decreases in word line and bit line resistance, via the use of metal silicide layers on gate structures as well as on source/drain regions. One method of forming metal silicide layers on these regions has been via use of a Self-ALIgned metal siliCIDE, (salicide), procedure, in which a blanket metal is deposited, annealed to form metal silicide on regions in which the metal layer overlaid silicon, (top surface of gate structure and source/drain region), followed by the removal of unreacted metal from insulator surfaces, such as insulator spacers located on the sides of the gate structure. However one problem encountered with the salicide procedure is the inability to completely remove unreacted metal from the insulator spacers, resulting in gate to substrate leakage or shorts. In addition prolonged anneal cycles, used to insure salicide reaction can result in the formation of metal silicide ribbons on the surface of the insulator spacers, extending from the gate structure to source/drain regions, again resulting in yield loss in terms of gate to substrate leakage or shorts.

The present invention will describe a procedure for forming metal silicide on source/drain regions via implantation of metal ions, only into the source/drain region, thus eliminating the risk of forming ribbons, or leaving unreacted metal, on the sides of the insulator spacers, sometimes encountered with the salicide procedure. Prior art, such as Fazan et al, in U.S. Pat. No. 6,087,700, describe a method of forming a metal silicide layer on a blanket polysilicon layer, prior to defining the metal silicide—polysilicon gate structure. That prior art however does not describe this present invention in which metal silicide is formed only on a source/drain region, via implantation of metal ions, only into the source/drain region.

SUMMARY OF THE INVENTION

It is an object of this invention to form a metal silicide layer only on a source/drain region of a MOSFET device.

It is another object of this invention to implant metal ions into a source/drain region of a MOSFET device.

It is yet another object of this invention to perform an anneal cycle to form metal silicide on the source/drain region, via reaction of the implanted metal ions and silicon, available from the source/drain region.

It is still yet another object of this invention to selectively remove unreacted metal ions from the surface of the metal silicide layer.

In accordance with the present invention a method of forming metal silicide on a source/drain region of a MOSFET device, is described. After formation of a silicon dioxide gate insulator layer, a polysilicon or polycide layer is deposited, followed by the deposition of a dielectric layer. Definition of a gate structure, capped with the dielectric layer, is followed by formation of a lightly doped source/drain, (LDD) region, in a region of the semiconductor substrate not covered by the capped gate structure. After formation of insulator spacers on the sides of the capped, gate structure, a heavily doped source/drain region is formed in a region of the semiconductor substrate not covered by the capped gate structure or by the insulator spacers. Metal ions are next implanted into the heavily doped source/drain region, followed by an anneal procedure, used to form the desired metal silicide layer. Unreacted metal ions are then selectively removed from the top surface of the metal silicide layer. An optional second anneal cycle can next be performed to create a lower resistance phase of the metal silicide layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
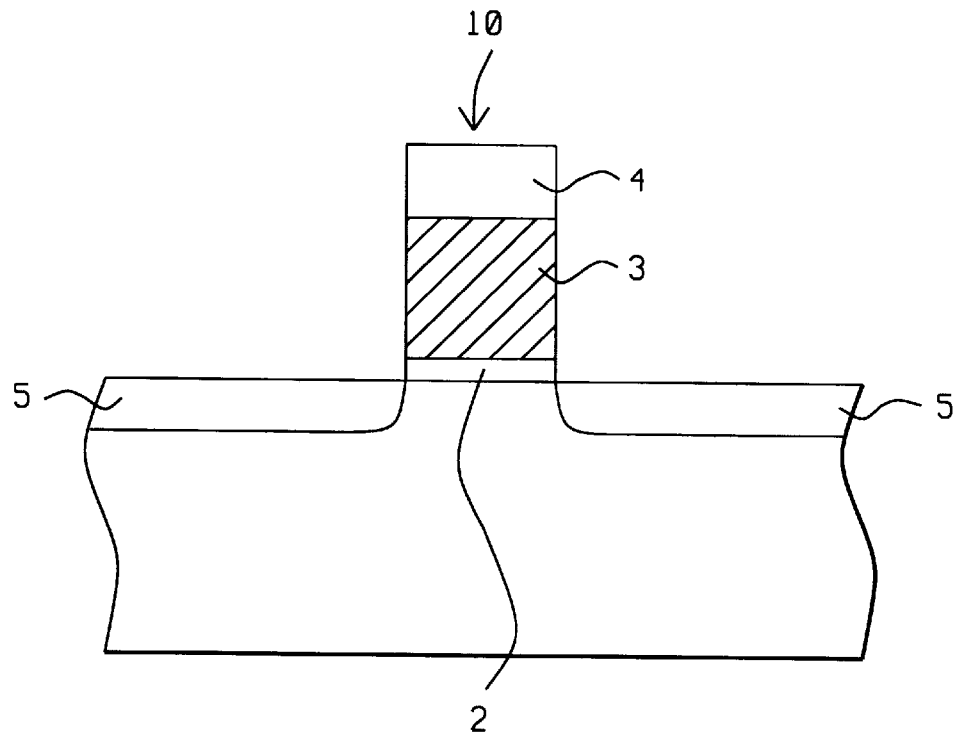
FIGS. 1–4, which schematically, in cross-sectional style, describe key stages of fabrication used to form a metal silicide layer on a source/drain region of a MOSFET device, featuring implantation of metal ions into the source/drain region.

The method of forming a metal silicide layer on a MOSFET source/drain region, featuring implanted metal ions, used for the metal component of the silicide layer, will now be described in detail. A P type, semiconductor substrate 1, comprised with single crystalline silicon, with a <100> crystallographic orientation, is used and schematically shown in FIG. 1. A silicon dioxide, gate insulator layer 2, is thermally grown, to a thickness between about 50 to 300 Angstroms, in an oxygen-steam ambient, at a temperature between about 800 to 1200° C. A polysilicon layer 3, is next deposited via low pressure chemical vapor deposition, (LPCVD), procedures, to a thickness between about 500 to 3500 Angstroms. Polysilicon layer 3, can be doped in situ, during deposition, via the addition of arsine, or phosphine, to a silane ambient, or polysilicon layer 3, can be deposited intrinsically then doped via implantation of arsenic or phosphorous ions. If desired a polycide layer, comprised of an overlying tungsten silicide layer, and an underlying polysilicon layer, can be used to replace more resistive polysilicon layer 3. This is accomplished via deposition of the underlying polysilicon layer, at a thickness between about 500 to 2000 Angstroms, via LPCVD procedures, followed by the deposition of an overlying tungsten silicide layer, again obtained using LPCVD procedures, to a thickness between about 500 to 1500 Angstroms. The underlying polysilicon layer again can be doped in situ, during deposition, or deposited intrinsically then doped via ion implantation procedures. Dielectric layer 4, comprised of either silicon oxide, or silicon nitride, is next deposited via LPCVD or plasma enhanced chemical vapor deposition (PECVD), procedures, to a thickness between about 300 to 2000 Angstroms. The result of these procedures are schematically shown in FIG. 1.

A photoresist shape, not shown in the drawings, is next used as an etch mask to allow an anisotropic, reactive ion etch (RIE), procedure to define capped gate structure 10, comprised of dielectric layer 4, on polysilicon or polycide layer 3. The RIE procedure is performed using $CF_4$ or $CHF_3$ as an etchant for dielectric layer 4, while $SF_6$ or $Cl_2$ is used to pattern polysilicon or polycide layer 3. Removal of the photoresist shape, used as a mask for definition of capped gate structure 10, is accomplished via plasma oxygen ashing and careful wet cleans, with a buffered hydrofluoric component of the wet cleans, removing the portion of silicon dioxide gate insulator layer 2, not covered by the capped gate structure. A lightly doped source/drain (LDD), region 5, is next formed in regions of semiconductor substrate 1, not covered by capped gate structure 10, via implantation of arsenic or phosphorous ions, at an energy between about 20 to 60 KeV, and at a dose between about 1E13 to 1E14 atoms/cm$^2$. The result of these procedures is schematically shown in FIG. 1.

Figure 2:
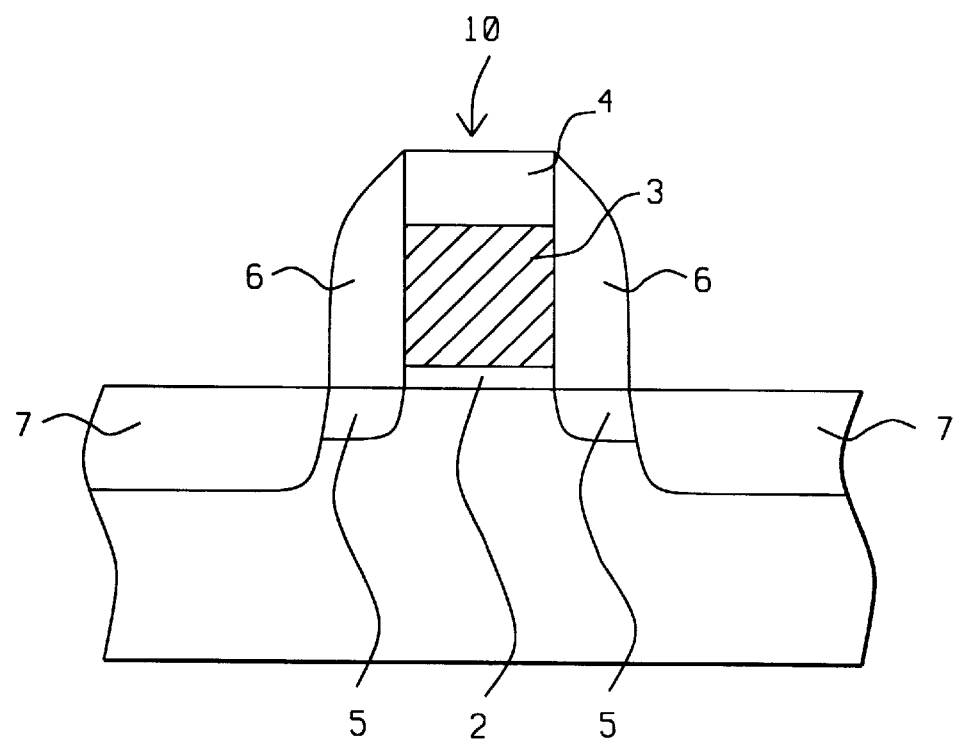

Insulator spacers 6, are next formed on the sides of capped gate structure 10. This is accomplished by deposition of an insulator layer such as silicon oxide, or silicon nitride, at a thickness between about 500 to 3000 Angstroms, using either LPCVD or PECVD procedures. An anisotropic RIE procedure, using either $CF_4$ or $CHF_3$ as an etchant, is used to create insulator spacers 6, located on the sides of capped gate structure 10. Heavily doped source/drain region 7, is next formed in regions of semiconductor substrate 1, not covered by capped gate structure 10, or by insulator spacers 6, via implantation of arsenic or phosphorous ions, at an energy between about 30 to 70 KeV, and at a dose between about 1E14 to 1E15 atoms/cm$^2$. The results of these procedures is schematically shown in FIG. 2. Although this invention is shown as applied to an N channel, MOSFET device, it can also be applied to a P channel, MOSFET device, by formation of an N well region in the semiconductor substrate, and the formation of P type LDD and P type heavily doped source/drain regions, in the N well region of the P channel, MOSFET device.

Figure 3:
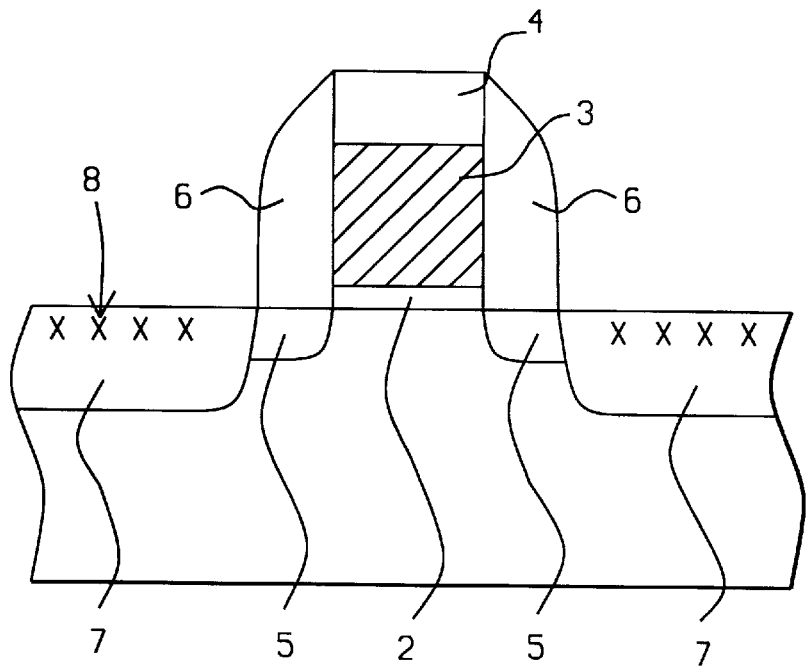
Figure 4:
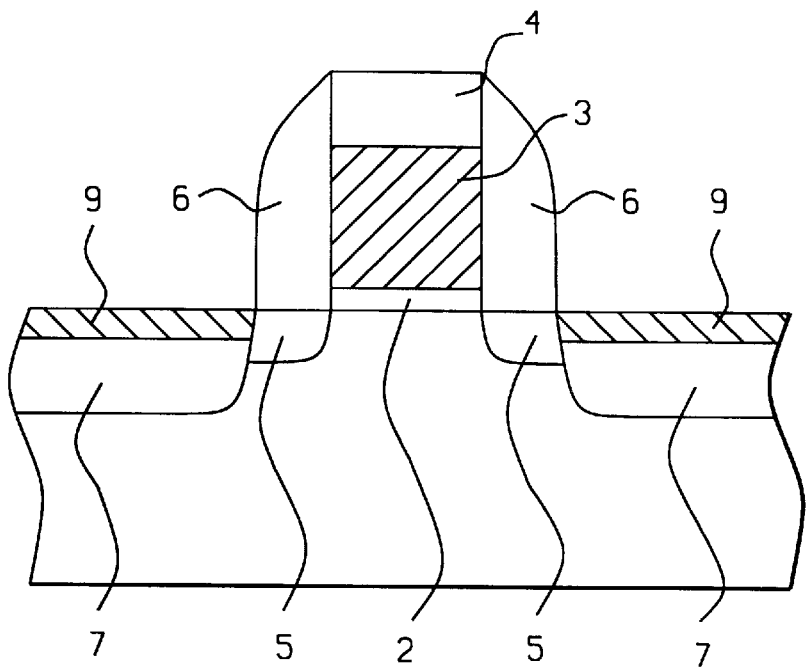

The method of forming metal silicide on a source/drain region, via implantation of metal ions, is next addressed and schematically shown in FIGS. 3–4. A blanket ion implantation procedure is performed placing metal ions 8, into a top portion of heavily doped source/drain region 7. This is schematically shown in FIG. 3. Dielectric layer 4, prevents implantation of metal ions 8, into the polysilicon or polycide component of capped gate structure 10. Metal ions 8, can be chosen from a group that includes titanium, tantalum, platinum, palladium, cobalt and nickel.

An anneal procedure is next employed to allow reaction of metal ions 8, and heavily doped source/drain region 7, resulting in the selective formation of metal silicide layer 9, at a thickness between about 30 to 1000 Angstroms, on heavily doped source/drain region 7. The conditions used for the anneal cycle are dependent on the metal ion used, and can be performed using conventional furnace procedures, or using rapid thermal anneal (RTA), procedures, in an nitrogen ambient. Selective removal of any unreacted metal ions, still remaining on the top surface of metal silicide layer 9, is next performed using a solution comprised of $H_2O_2$—$NH_4OH$—$H_2O$, at a temperature between about 60 to 100° C. If lower source/drain resistance is desired a second RTA procedure can be performed to convert metal silicide layer 9, to a lower resistance phase. This procedure using metal implantation as a component of the metal silicide formation reduces the risk of substrate, (source/drain), to gate shorts, sometimes encountered using the procedure in which the metal layer is deposited, with subsequent unreacted metal, or metal silicide ribbons, having to be removed from the insulator spacer to prevent substrate to gate leakage or shorts.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a metal oxide semiconductor field effect transistor (MOSFET), device on a semiconductor substrate, comprising the steps of:
    forming a gate insulator layer on said semiconductor substrate;
    forming a gate structure, capped with a dielectric layer, on said gate insulator layer;
    forming a lightly doped source/drain region in an area of said semiconductor substrate not covered by the said capped gate structure;
    forming insulator spacers on the sides of said capped gate structure;
    forming a heavily doped source/drain region in an area of said semiconductor substrate not covered by said capped gate structure or by said insulator spacers;
    implanting metal ions into a top portion of said heavily doped source/drain region;
    performing an anneal procedure to form a metal silicide layer on the top surface of said heavily doped source/drain region, with said metal silicide layer formed from a first portion of said metal ions, while a second portion of said metal ions remain unreacted; and
    selectively removing said unreacted metal ions.

2. The method of claim 1, wherein said gate insulator layer is a silicon dioxide layer, at a thickness between about 50 to 300 Angstroms, obtained via thermal oxidation procedures, performed in an oxygen—steam ambient at a temperature between about 800 to 1200° C.

3. The method of claim 1, wherein said capped gate structure is capped with a dielectric layer of silicon oxide, or silicon nitride, obtained via LPCVD or PECVD procedures, to a thickness between about 300 to 2000 Angstroms.

4. The method of claim 1, wherein said capped gate structure is formed from a polysilicon layer, obtained via LPCVD procedures at a thickness between about 500 to 3500 Angstroms, and either in situ doped during deposition via the addition of arsine or phosphine to a silane ambient, or deposited intrinsically then doped via implantation of arsenic or phosphorous ions.

5. The method of claim 1, wherein said capped gate structure is formed from a polycide layer comprised of an underlying polysilicon layer, obtained via LPCVD procedures at a thickness between about 500 to 2000 Angstroms, and comprised of an overlying tungsten silicide layer, obtained via LPCVD procedures, at a thickness between about 500 to 1500 Angstroms.

6. The method of claim 1, wherein said insulator spacers are comprised of silicon oxide, or silicon nitride, obtained via LPCVD or PECVD procedures, at a thickness between about 500 to 3000 Angstroms, then defined via an anisotropic RIE procedure using $CF_4$ or $CHF_3$ as an etchant.

7. The method of claim 1, wherein said heavily doped source/drain region is formed via ion implantation of arsenic or phosphorous ions, at an energy between about 30 to 70 KeV, at a dose between about 1E14 to 1E15 atoms/cm$^2$.

8. The method of claim 1, wherein said metal ions are chosen from a group that includes titanium, tantalum, platinum, palladium, nickel, and cobalt, obtained via ion implantation procedures.

9. The method of claim 1, wherein said metal silicide layer is formed at a thickness between about 30 to 1000 Angstroms, via a rapid thermal anneal procedure, performed in a nitrogen ambient.

10. The method of claim 1, wherein said unreacted metal ions are selectively removed in a solution comprised of $H_2O_2$—$NH_4OH$—$H_2O$, at a temperature between about 60 to 100° C.

11. A method of forming a metal silicide layer on a MOSFET source/drain region, in a semiconductor substrate, featuring implantation of metal ions into said source/drain region to provide a metal component for said metal silicide layer, comprising the steps of:

providing a insulator capped, polycide gate structure on an underlying silicon dioxide gate insulator layer, with insulator spacers located on the sides of said insulator capped, polycide gate structure, and with a heavily doped source/drain region located in a region of said semiconductor substrate not covered by said insulator capped, polycide gate structure, or by said insulator spacers;

implanting said metal ions into a top portion of said heavily doped source/drain region;

performing a first rapid thermal anneal procedure to form said metal silicide layer on said heavily doped source/drain region, via use of a first portion of said metal ions, while a second portion of said metal ions remain unreacted;

selectively removing unreacted, said second portion of metal ions; and performing a second rapid thermal anneal procedure to convert said metal silicide layer to a lower resistance metal silicide layer.

12. The method of claim 11, wherein said silicon dioxide gate insulator layer is grown to a thickness between about 50 to 300 Angstrom, via thermal oxidation procedures, performed in an oxygen—steam ambient at a temperature between about 800 to 1200° C.

13. The method of claim 11, wherein said polycide gate structure, of said insulator capped, polycide gate structure is comprised of an underlying polysilicon layer, obtained via LPCVD procedures at a thickness between about 500 to 2000 Angstroms, and comprised of an overlying tungsten silicide layer, obtained via LPCVD procedures at a thickness between about 500 to 1500 Angstroms.

14. The method of claim 11, wherein insulator layer of said insulator capped, polycide gate structure is a silicon oxide, or silicon nitride layer, obtained via LPCVD or PECVD procedures, to a thickness between about 300 to 2000 Angstroms.

15. The method of claim 11, wherein said insulator spacers are comprised of silicon oxide, or silicon nitride, obtained via LPCVD or PECVD procedures, at a thickness between about 500 to 3000 Angstroms, then defined via an anisotropic RIE procedure using $CF_4$ or $CHF_3$ as an etchant.

16. The method of claim 11, wherein said heavily doped source/drain region is formed via ion implantation of arsenic or phosphorous ions, at an energy between about 30 to 70 KeV, and at a dose between about 1E14 to 1ED15 atoms/$cm^2$.

17. The method of claim 11, wherein said metal ions are chosen from a group that includes titanium, tantalum, platinum, palladium, nickel, and cobalt, obtained via ion implantation procedures.

18. The method of claim 11, wherein said first rapid thermal anneal procedure, used to form said metal silicide layer, is performed in a nitrogen ambient.

19. The method of claim 11, wherein said metal silicide layer is formed at a thickness between about 30 to 1000 Angstroms.

20. The method of claim 11, wherein said unreacted, second portion of metal ions are selectively removed in a solution comprised of $H_2O_2$—$NH_4OH$—$H_2O$, at a temperature between about 60 to 100° C.

21. The method of claim 11, wherein said second rapid thermal anneal procedure, used to convert said metal silicide layer to a lower resistance metal silicide layer is performed in a nitrogen ambient.

* * * * *